United States Patent [19]

Tokunoh

[11] Patent Number: 5,047,836

[45] Date of Patent: Sep. 10, 1991

[54] TEMPERATURE COMPENSATING CONTACT TO AVOID MISREGISTRATION

[75] Inventor: Futoshi Tokunoh, Itami, Japan

[73] Assignee: Mitsubishi Denki Kabushiki Kaisha, Tokyo, Japan

[21] Appl. No.: 593,383

[22] Filed: Oct. 2, 1990

Related U.S. Application Data

[63] Continuation of Ser. No. 278,469, Dec. 1, 1988, abandoned.

[30] Foreign Application Priority Data

Dec. 3, 1987 [JP] Japan .................. 62-308055

[51] Int. Cl.$^5$ .................. H01L 23/42; H01L 23/44; H01L 23/46; H01L 23/02
[52] U.S. Cl. ........................ 357/79; 357/74; 357/81
[58] Field of Search ............... 357/74, 79, 81

[56] References Cited

FOREIGN PATENT DOCUMENTS

| | | |
|---|---|---|
| 0220698 | 10/1986 | European Pat. Off. . |
| 2641483 | 3/1978 | Fed. Rep. of Germany . |
| 2077332 | 1/1971 | France . |
| 58-207644 | 12/1983 | Japan .................. 357/79 |
| 615533 | 1/1986 | Japan .................. 357/80 |
| 61-136269 | 6/1986 | Japan .................. 357/79 |

Primary Examiner—Andrew J. James
Assistant Examiner—Stephen D. Meier
Attorney, Agent, or Firm—Oblon, Spivak, McClelland, Maier & Neustadt

[57] ABSTRACT

According to the present invention, one surface of a temperature compensator is arranged to face the surface of a first electrode which is formed on one surface of a semiconductor element while one surface of a first external electrode is arranged to face the other surface of the temperature compensator. A second external electrode is arranged in a space region which is defined by a through hole of the temperature compensator and a cavity of the first external electrode, to face the surface of a second electrode. An insulator is interposed between the outer side surface of the second external electrode and the inner side surfaces of the cavity and the through hole so that the second external electrode is located in prescribed positional relation to the first external electrode and the temperature compensator. Thus, there is no possibility that the misregistration is caused between the temperature compensator, the first external electrode, the second external electrode and the insulator, whereby the temperature compensator and the second electrode can be correctly and easily aligned with the first electrode and the second external electrode, respectively.

5 Claims, 5 Drawing Sheets

TEMPERATURE COMPENSATING CONTACT TO AVOID MISREGISTRATION

This application is a continuation of application Ser. No. 07/278,469, filed on Dec. 1, 1988, now abandoned.

BACKGROUND OF THE INVENTION

1. Field of the Invention

The present invention relates to a semiconductor device, and more particularly, it relates to a pressure-connection type semiconductor device such as a thryristor or a high-power transistor.

2. Description of the Background Art

Japanese Patent Laying-Open Gazette No. 79669/1987 discloses a conventional semiconductor device of this type. FIG. 1 is a sectional view showing the semiconductor device according to this prior art example.

Referring to FIG. 1, a thyristor element 1 is provided in the form of a disc, while a gate electrode 1b and a cathode electrode 1c are provided on the lower surface of a semiconductor substrate 1a in inner and outer peripheral regions, respectively. An anode electrode 1d is provided on the upper surface of the semiconductor substrate 1a. A doughnut-shaped temperature compensator 2 is pressed on the cathode electrode 1c to be electrically in contact with only that. An external cathode electrode 3 is pressed on the temperature compensator 2 to be electrically in contact with only that. Further, a discoidal external anode electrode 4 is pressed on the anode electrode 1d to be electrically in contact with only that. A flange 5a is provided on the outer peripheral region of the external cathode electrode 3, while a flange 5b is provided on the outer peripheral region of the external anode electrode 4. An insulating sleeve 6 couples these flanges 5a and 5b with each other, to thereby integrally couple the external cathode electrode 3 with the external anode electrode 4 while maintaining an electrically insulated state.

A disc spring 7 and an insulator 8, the configuration of which is shown in FIG. 2, are received in this order in a cavity 3a defined in a central portion of the external cathode electrode 3. A gate lead 10 is inserted in a through hole 8a defined in an upper central portion of the insulator 8 and an insulating tube 9, so that the first end of the gate lead 10 is press on the gate electrode 1b to be electrically in contact with that by spring force of the disc spring 7 through the insulator 8, while the second end thereof is electrically connected with a gate terminal 11.

Assembly sequence of the semiconductor device shown in FIG. 1 is as follows: First, the gate lead 10 is inserted in the through hole 8a of the insulator 8 and the insulating tube 9, to thereby form an assembly A. Then the disc spring 7 and the assembly A are introduced in this order into the cavity 3a of the external cathode electrode 3, and the temperature compensator 2 is placed on the upper surface of the external cathode electrode 3. Further, the thyristor element 1 is so arranged that the temperature compensator 2 faces the cathode electrode 1c and that an end of the gate lead 10 faces the gate electrode 1b. Finally, the external anode electrode 4 is placed on the anode electrode 1d of the thyristor element 1, and the flanges 5a and 5b are coupled with each other by the insulating sleeve 6 with externally applying pressure to the external cathode electrode 3 and the external anode electrode 4.

FIG. 3 illustrates positional relation between the temperature compensator 2, the external cathode electrode 3, the insulator 8 and the gate lead 10. As shown in FIG. 3, a clearance is defined between the insulator 8 and the gate lead 10 since the bore diameter a of the through hole 8a of the insulator 8 is larger than the outer diameter b of the gate lead 10, whereby misregistration may be caused between the insulator 8 and the gate lead 10. Similarly to the above, another clearance is defined between the insulator 8 and the external cathode electrode 3 since the inner diameter c of the cavity 3a of the external cathode electrode 3 is larger than the outer diameter d of the insulator 8, whereby misregistration may be caused between the external cathode electrode 3 and the insulator 8. Further, still another clearance is defined between the temperature compensator 2 and the insulator 8 since the inner diameter e of a through hole 2a provided in the central portion of the temperature compensator 2 is larger than the outer diameter d of the insulator 8, whereby misregistration may be caused between the temperature compensator 2 and the insulator 8. In other words, the conventional semiconductor has no function of relatively locating the temperature compensator 2, the external cathode electrode 3, the insulator 8 and the gate lead 10. Thus, misregistration may be caused between these elements. When the temperature compensator 2, the external cathode electrode 3, the insulator 8 and the gate lead 10 are dislocated as shown in FIG. 4, for example, the lower surface of the gate electrode 1b (FIG. 1) cannot correctly face the first end of the gate lead 10, while the lower face of the cathode electrode 1c (FIG. 1) cannot correctly face the upper surface of the temperature compensator 2, to thereby disable correct pattern alignment.

Similar problems are also caused in a statict induction thyristor, a gate turn-off thyristor, a high-power transistor and the like. Particularly in such devices, improvement in degree of integration and increase in bore diameter of semiconductor elements, which have been required in recent years, are difficult to attain if the aforementioned clearances are defined. With improvement in degree of integration and increase in bore diameter of the semiconductor elements, numbers of gate electrodes etc. provided on the semiconductor elements are increased to, so that the number of portions requiring alignment are also increased, whereas it is difficult to correctly align all of such portions.

SUMMARY OF THE INVENTION

A semiconductor device according to the present invention comprises a semiconductor element which has first and second electrodes respectively provided on first and second regions of its one surface, a temperature compensator provided with a through hole in a region corresponding to the second electrode and having one surface arranged to face the surface of the first electrode, a first external electrode provided with a cavity in a region corresponding to the second electrode within its one surface, which surface is arranged to face another surface of the temperature compensator, a second external electrode arranged in a space region defined by the through hole and the cavity to face the surface of the second electrode, an insulator interposed between the outer side surface of the second external electrode and the inner side surface of the cavity and between the outer side surface of the second external electrode and the inner side surface of the trough hole to locate the second external electrode in prescribed positional relation to the first external electrode and the temperature compensator and pressure connection means for applying pressure to the semiconductor element and the first external electrode to pressure-connect junction surfaces between the first electrode and the temperature compensator, between the temperature compensator and the first external electrode and between the second electrode and the second external electrode, respectively.

Accordingly, a principal object of the present invention is to provide a semiconductor device which can correctly and easily perform alignment between the first electrode of the semiconductor element and the temperature compensator and between the second electrode of the semiconductor element and the second external electrode.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
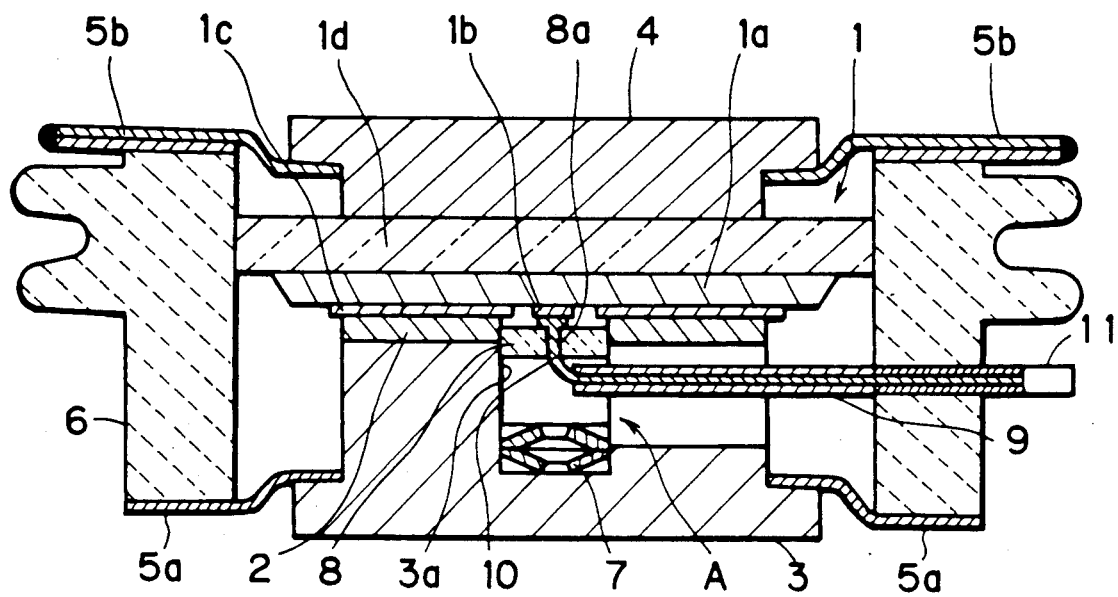
FIG. 1 is a sectional view showing a conventional semiconductor device.
Figure 2:
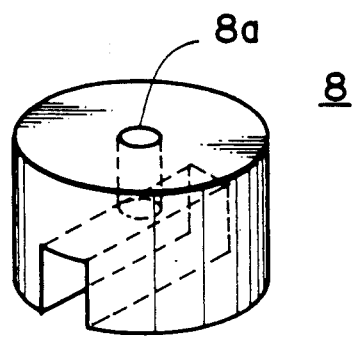
FIG. 2 is a perspective view of an insulator, which is an element for the semiconductor device shown in FIG. 1.
Figure 3:
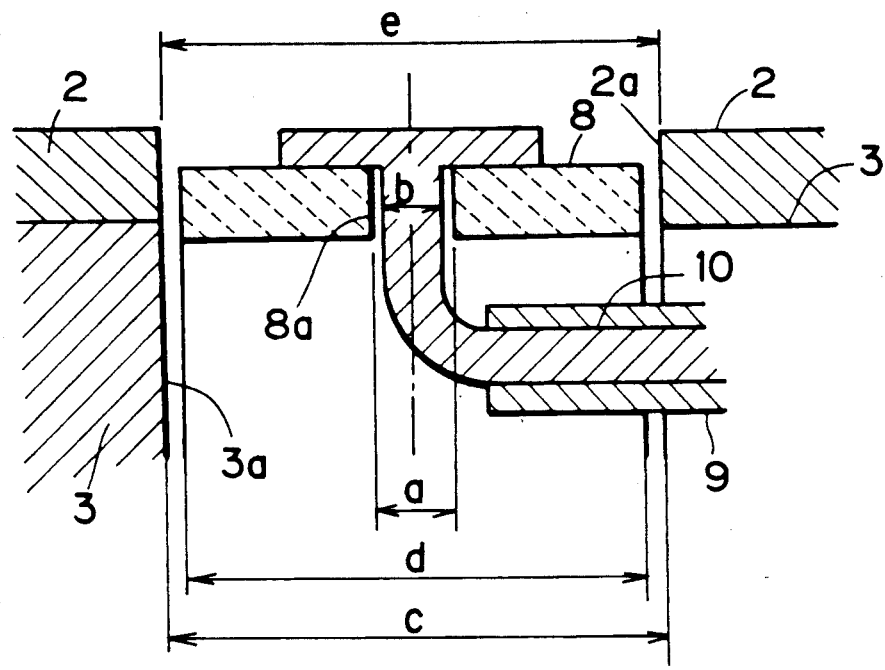
FIG. 3 illustrates positional relation between a temperature compensator, an external cathode electrode, an insulator and a gate lead of the semiconductor device shown in FIG. 1.
Figure 4:
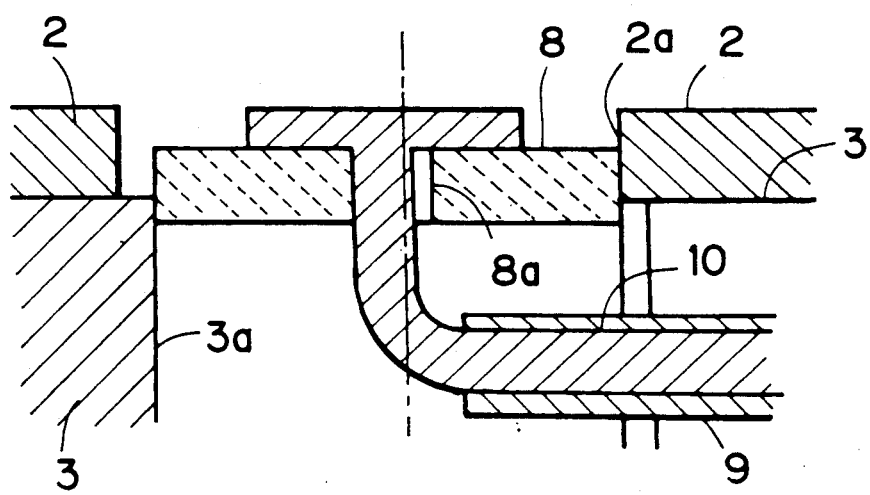
FIG. 4 illustrates exemplary positional relation between the temperature compensator, the external cathode electrode, the insulator and the gate lead of the semiconductor device shown in FIG. 1 in case of misregistration.
Figure 5:
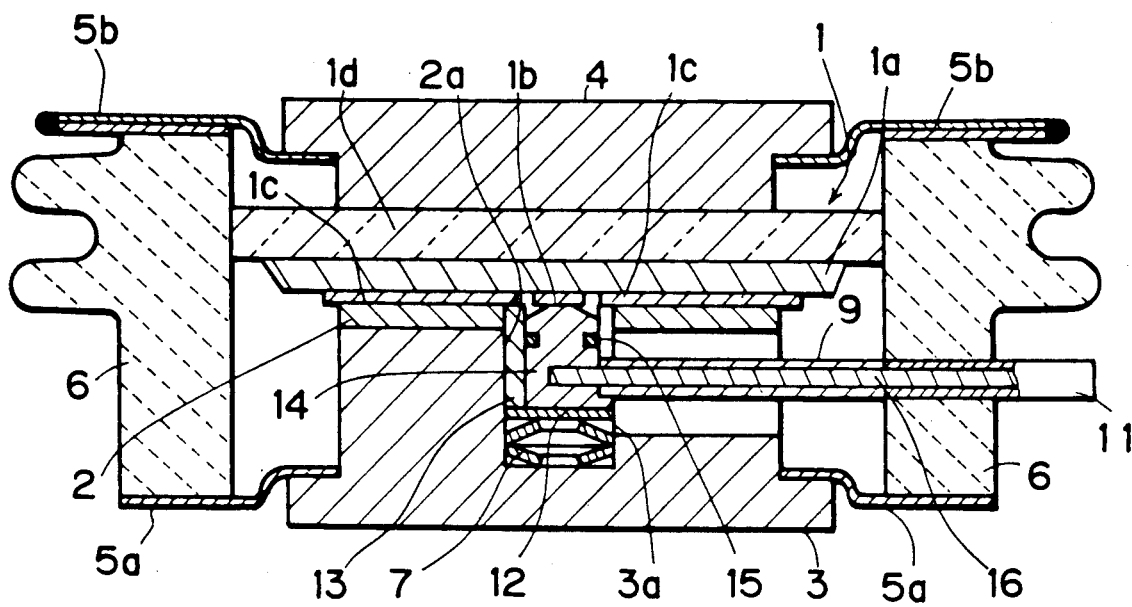
FIG. 5 is a sectional view showing an embodiment of a semiconductor device according to the present invention.

FIG. 5 is a sectional view showing a semiconductor device according to an embodiment of the present invention. Referring to FIG. 5, a thyristor element 1 is similar in structure to that of the prior art shown in FIG. 1. In correspondence to a gate electrode 1b, a through hole 2a is defined in a central portion of a temperature compensator 2 and a cavity 3a is defined in an upper central portion of an external cathode electrode 3, respectively. The inner diameter of the through hole 2a is preferably smaller than that of the cavity 3a, while the former may be identical to the latter.

The upper surface of the external cathode electrode 3a faces the lower surface of the temperature compensator 2, while the external cathode electrode 3 is pressed on the temperature compensator 2 to be electrically in contact with only that. A space region defined by the through hole 2a and the cavity 3a is adapted to receive a disc spring 7, an insulating plate 12 and a substantially cylindrical insulator 13, being C-shaped in section and having an outer diameter equal to the inner diameter of the space region, in this order. Thus, the outer side surface of the insulator 13 is brought into close contact with the inner side surfaces of the through hole 2a and the cavity 3a. In place of the insulator 13 whose outer diameter is equal to the inner diameter of the space region, an elastic insulator having an outer diameter larger than the inner diameter of the space region may be employed so as to be fitted with pressure in the space region. In this case, the outer side surface of such an insulator is further strongly adhered to the inner side surfaces of the through hole 2a and the cavity 3a.

Figure 6A:
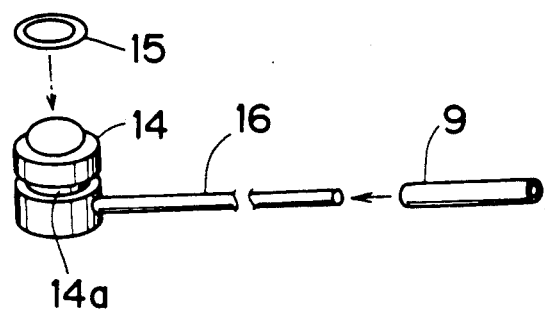
FIG. 6A is a perspective view showing an assembly, which is an element for the semiconductor device shown in FiG. 5, in a state before assembling.

An assembly B (FIG. 6B), which is assembled along the procedure shown in FIG. 6A, is fitted with pressure in the insulator 13. Thus, the bottom surface of an external gate electrode 14 forming the assembly B is upwardly urged by spring force to the disc spring 7 through the insulating plate 12, so that the upper surface thereof is pressed on the gate electrode 1b to be electrically in contact with that.

The temperature compensator 2, which is doughnut-shaped similarly to that of that of the prior art, is pressed on a cathode electrode 1c to be electrically in contact with only that. A discoidal external anode electrode 4 is pressed on an anode electrode 1d to be electrically in contact with that. Further, a flange 5a is provided on the outer periphery of the external cathode electrode 3, while another flange 5b is provided on the outer periphery of the external anode electrode 4. These flanges 5a and 5b are couple with each other by an insulating sleeve 6 with externally applying pressure to the external cathode electrode 3 and the external anode electrode 4, to thereby integrally couple the external cathode electrode 3 with the external anode electrode 4, while there is an electrically insulated state between the external cathode electrode 3 and the external anode electrode 4.

As understood from the above description, the substantially cylindrical insulator 13 being C-shaped in section and having an outer diameter equal to or larger than the inner diameter of the space region defined by the through hole 2a of the temperature compensator 2 and the cavity 3a of the external cathode electrode 3, is fitted with pressure in the space region in this embodiment, whereby the insulator 13 is adhered to the external cathode electrode 3 as well as to the temperature compensator 2. Thus, there is no clearance between the insulator 13 and the external cathode electrode 3 or the temperature compensator 2. Further, the assembly B (FIG. 6B) is fitted with pressure in the insulator 13, whereby the insulator 13 is adhered to the external gate electrode 14 forming the assembly B. Thus, there is no clearance between the insulator 13 and the external gate electrode 14. Namely, the insulator 13 locates the external gate electrode 14 in prescribed positional relation to the temperature compensator 2 and the external cathode electrode 3.

Therefore, there is no possibility that the misregistration is caused between the temperature compensator 2, the external cathode electrode 3, the insulator 13 and the external gate electrode 14, whereby the gate electrode 1b and the cathode electrode 1c can be easily and correctly aligned with the external gate electrode 14 and the temperature compensator 2, respectively.

Figure 6B:
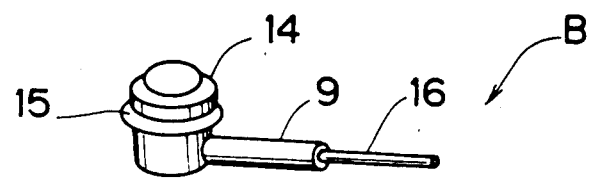
FIG. 6B is a perspective view showing the assembly which is completely assembled.
Figure 7:
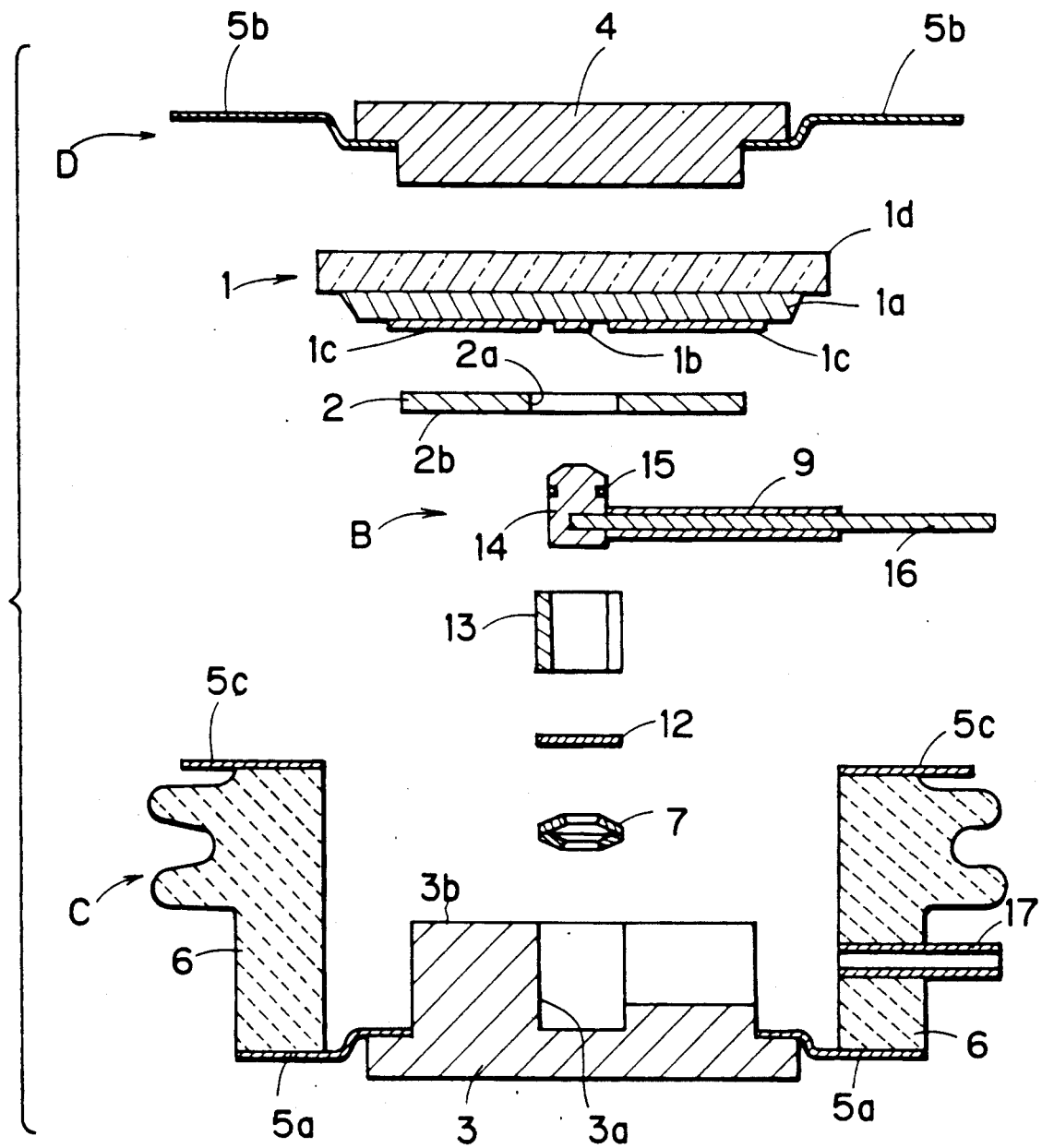
FIG. 7 is a sectional view of the semiconductor device shown in FIG. 5 in a state before assembling.

FIG 7 is a sectional view illustrating the semiconductor device shown in FIG. 5 in a state before assembling. The semiconductor device shown in FIG. 5 is assembled in the following procedure:

First, an O-ring 15 is mounted on an annular groove 14a of the external gate electrode 14 and a gate lead 16 is inserted into an insulating tube 9 as shown in FIG. 6A, to thereby form the assembly B shown in FIG. 6B. Before completion of the assembly B, the inner diameter of the o-ring 15 is preferably set to be smaller than the outer diameter of the external gate electrode 14 in the portion of the annular groove 14a. Further, it is necessary to set the outer diameter of the O-ring 15 to be larger than the inner diameter of the insulator 13 upon completion of the assembly B.

Further, the insulating sleeve 6, the external cathode electrode 3, the flanges 5a and 5c and a gate pipe 17 are respectively brazed by silver solder (not shown) or the like, to thereby form an assembly C. In addition, the external anode electrode 4 and the flange 5b are brazed by silver solder (not shown) or the like, to thereby form an assembly D.

The disc spring 7, the insulating plate 12 and the insulator 13 are introduced in this order into the cavity 3a which is defined in the central portion of the external cathode electrode 3.

A part (external gate electrode 14) of the assembly B is fitted with pressure in the insulator 13, while a part of the gate lead 16 not covered with the insulating tube 9 is inserted in the gate pipe 17.

The insulator 13 is engaged into the through hole 2a of the temperature compensator 2, while a lower surface 2b of the temperature compensator 2 is placed on an upper surface 3b of the external cathode electrode 3.

Further, the thyristor element 1 and the assembly D are arranged in this order on the temperature compensator 2, then the outer peripheries of the flanges 5b and 5c are arc-welded with external applying pressure to the external cathode electrode 3 and the external anode electrode 4.

Finally, the forward portion of the gate pipe 17 is welded to form a gate terminal 11 (FIG. 5).

Thus, the semiconductor device is so assembled that the thyristor element 1, the temperature compensator 2, the external cathode electrode 3, the external gate electrode 14 and the external anode electrode 4 are pressure-connected with each other.

Although the O-ring 15 is employed in the above embodiment in order to improve adhesion between the insulator 13 and the external gate electrode 14, such an O-ring is not a requisite element. The insulator 13 and the external gate electrode 14 may be so accurately formed that the insulator 13 and the external gate electrode 14 are sufficiently adhered to each other with no provision of the O-ring 15.

Figure 8:
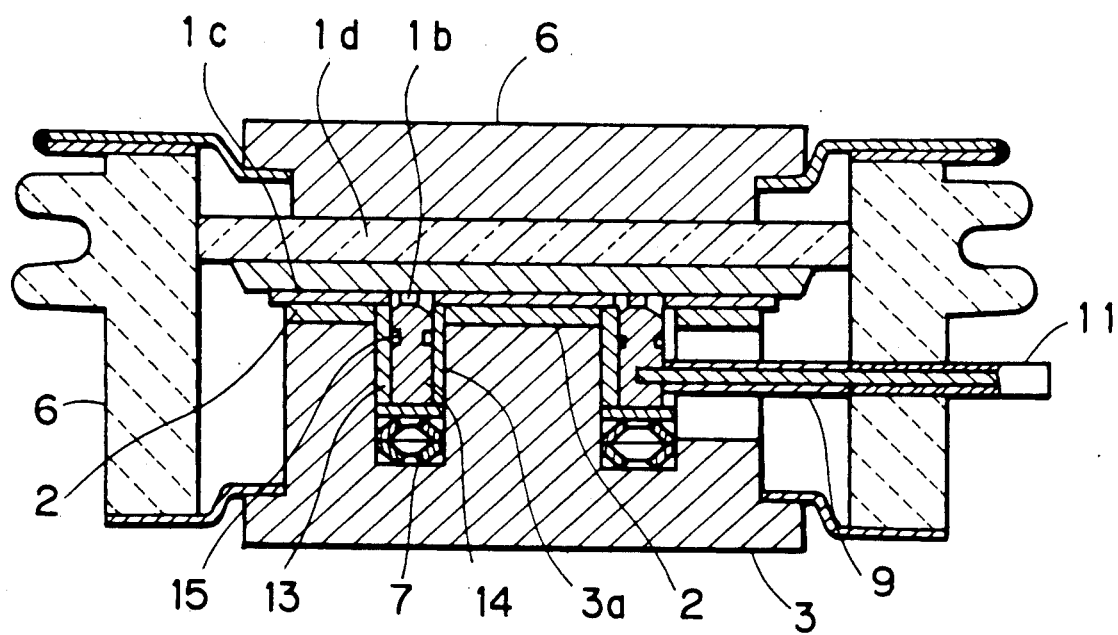
FIG. 8 is a sectional view showing another embodiment of a semiconductor device according to the present invention.

Although the above embodiment has been described with reference to a center gate type semiconductor device (FIG. 5), the present invention is not restricted to this but also applicable to a ring gate type semiconductor device which is shown in FIG. 8.

Further, although the semiconductor element is implemented by the thyristor element 1 in the above embodiment, such a semiconductor element may be prepared by a static induction thyristor, a gate turn-off thyristor or a high-power transistor. Namely, the present invention can be applied to the static induction type thyristor et al., by application of the present invention a gate electrode and a cathode electrode (or source or emitter electrode) can be easily and correctly align with an external gate electrode and a temperature compensator, respectively.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   semiconductor element having first and second electrodes respectively on first and second regions of one surface of said semiconductor element;
   a temperature compensator provided with a through hole in a region corresponding to said second electrode, said temperature compensator having a first surface arranged to face a surface of said first electrode;
   a first external electrode having a cavity defined in a region corresponding to said second electrode and having one surface arranged to face a second surface of said temperature compensator;
   a second external electrode arranged in a space region defined by said through hole and said cavity to face a surface of said second electrode;
   an insulator interposed between the outer side surface of said second external electrode and the inner side surface of said cavity and between the outer side surface of said second external electrode and the inner side surface of said through hole to locate said second external electrode in prescribed positional relation to said first external electrode and said temperature compensator, wherein said insulator is formed by a substantially cylindrical elastic member which is C-shaped in section and has an outer diameter larger than the inner diameter of said cavity of said first external electrode and larger than the inner diameter of said through hole of said temperature compensator in order to form a friction fit; and
   pressure connection means for applying pressure to said semiconductor element and said first external electrode to pressure-connect junction surfaces between said first electrode and said temperature compensator, between said temperature compensator and said first external electrode and between said second electrode and said second external electrode, respectively.

2. A semiconductor device in accordance with claim 1, further comprising a ring-shaped elastic member interposed between the outer side surface of said second external electrode and the inner side surface of the said insulator.

3. A semiconductor device according to claim 2, wherein the outer diameter of said ring shaped elastic member is larger than the inner diameter of said insulator.

4. A semiconductor device according with claim 2, wherein said ring-shaped elastic member is mounted on an annular groove of said second external electrode.

5. A semiconductor device according to claim 4, wherein the inner diameter of said ring-shaped elastic member is smaller than the outer diameter of said second external electrode in the portion of said annular groove.

* * * * *